United States Patent
Otsubo et al.

(10) Patent No.: US 10,021,787 B2
(45) Date of Patent: Jul. 10, 2018

(54) RESIN SUBSTRATE COMBINED STRUCTURE

(71) Applicant: Murata Manufacturing Co., Ltd., Nagaokakyo-shi, Kyoto-fu (JP)

(72) Inventors: Yoshihito Otsubo, Nagaokakyo (JP); Keisuke Araki, Nagaokakyo (JP); Yuki Ito, Nagaokakyo (JP); Kenji Kubota, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/373,545

(22) Filed: Dec. 9, 2016

(65) Prior Publication Data

US 2017/0094793 A1   Mar. 30, 2017

Related U.S. Application Data

(63) Continuation of application No. PCT/JP2015/066742, filed on Jun. 10, 2015.

(30) Foreign Application Priority Data

Jun. 23, 2014 (JP) ................................. 2014-128184

(51) Int. Cl.
*H05K 1/00* (2006.01)
*H05K 1/14* (2006.01)
(Continued)

(52) U.S. Cl.
CPC ............. *H05K 1/147* (2013.01); *H05K 1/028* (2013.01); *H05K 1/0243* (2013.01); *H05K 1/0313* (2013.01); *H05K 1/181* (2013.01)

(58) Field of Classification Search
CPC .......... H05K 1/28; H05K 1/147; H05K 1/181; H05K 1/243; H05K 1/313; H05K 3/205; H05K 3/4655
(Continued)

(56) References Cited

U.S. PATENT DOCUMENTS 4,874,908 A    10/1989  Johansson
5,374,469 A *  12/1994  Hino ...................... H05K 3/205
                                                             428/209
(Continued)

FOREIGN PATENT DOCUMENTS

JP    64-001292 A   1/1989
JP    64-031309 A   2/1989
(Continued)

OTHER PUBLICATIONS

Official Communication issued in corresponding International Application PCT/JP2015/066742, dated Aug. 4, 2015.

*Primary Examiner* — Xiaoliang Chen
(74) *Attorney, Agent, or Firm* — Keating & Bennett, LLP

(57) ABSTRACT

A resin substrate combined structure includes a first resin substrate including a flexible resin defining a main material and includes a first portion, a second resin substrate including a flexible resin defining a main material and includes a second portion spaced from the first portion in a thickness direction, and an insulating member that envelops the first portion and the second portion while retaining a relative positional relationship between the first portion and the second portion. The insulating member includes a material with a higher rigidity than any of the main material of the first resin substrate and that of the second resin substrate.

20 Claims, 4 Drawing Sheets

(51) Int. Cl.
*H05K 1/02* (2006.01)
*H05K 1/03* (2006.01)
*H05K 1/18* (2006.01)

(58) Field of Classification Search
USPC .......... 174/254, 251, 258; 428/209; 257/777
See application file for complete search history.

(56) References Cited

U.S. PATENT DOCUMENTS

| | | | | |
|---|---|---|---|---|
| 9,232,636 | B2* | 1/2016 | Ozeki | ................... C08G 69/48 |
| 2008/0265430 | A1* | 10/2008 | Ishihara | ................ H01L 23/481 |
| | | | | 257/777 |
| 2009/0151990 | A1* | 6/2009 | Nishino | ............... H05K 3/4655 |
| | | | | 174/258 |
| 2013/0256002 | A1* | 10/2013 | Ozeki | ................... C08G 69/48 |
| | | | | 174/251 |

FOREIGN PATENT DOCUMENTS

| | | |
|---|---|---|
| JP | 05-283586 A | 10/1993 |
| JP | 07-183663 A | 7/1995 |
| JP | 2003-243778 A | 8/2003 |
| JP | 2003-243779 A | 8/2003 |
| JP | 2004-166410 A | 6/2004 |
| JP | 2007-067237 A | 3/2007 |
| JP | 2007-134473 A | 5/2007 |
| JP | 2011-071442 A | 4/2011 |
| JP | 2012-060026 A | 3/2012 |

* cited by examiner

RESIN SUBSTRATE COMBINED STRUCTURE

CROSS REFERENCE TO RELATED APPLICATIONS

This application claims the benefit of priority to Japanese Patent Application No. 2014-128184 filed on Jun. 23, 2014 and is a Continuation Application of PCT Application No. PCT/JP2015/066742 filed on Jun. 10, 2015. The entire contents of each application are hereby incorporated herein by reference.

BACKGROUND OF THE INVENTION

1. Field of the Invention

The present invention relates to a resin substrate combined structure. A "resin substrate combined structure" as referred to herein means a structure in a form in which a plurality of resin substrates are combined.

2. Description of the Related Art

There is a case in which a flexible resin substrate such as a resin multilayer substrate is disposed in a narrow casing and thus used or a plurality of resin substrates are combined together and thus used for high-density interconnect. When disposing a resin substrate in a casing, there is a case requiring disposing the resin substrate such that the resin substrate leaves a necessary space. Furthermore, there is a case requiring disposing a plurality of resin substrates simultaneously in a limited space. In these cases, in order to avoid an electromagnetic effect or dispose the substrates with the electromagnetic effect considered, a technique to control a spacing between the plurality of resin substrates, as desired, or a technique to maintain the spacing is required. Japanese Patent Laying-Open No. 2007-134473 describes a configuration in which what is referred to as a flexible circuit board is bent and the bent portion has an inner surface with a shape retaining member disposed thereon.

The technique described in Japanese Patent Laying-Open No. 2007-134473 can retain a single flexible circuit board's bent shape, however, in Japanese Patent Laying-Open No. 2007-134473 a case in which a plurality of flexible circuit boards are adjacently disposed in a small space is not assumed. When a plurality of flexible circuit boards having the configuration described in Japanese Patent Laying-Open No. 2007-134473 are adjacently disposed, their mutual spacings cannot be controlled and their mutual distances may undesirably vary or they may contact each other. In such a case, it is believed that variation in electrical characteristics is caused by electromagnetic interference. Furthermore, there is also a possibility that an undesirable bending stress will act and an interconnect may be disconnected.

SUMMARY OF THE INVENTION

Accordingly, preferred embodiments of the present invention provide a resin substrate combined structure that allows a plurality of resin substrates to be located in a limited space with a desired relative positional relationship maintained.

A resin substrate combined structure according to a preferred embodiment of the present invention includes a first resin substrate including a flexible resin defining a main material and a first portion; a second resin substrate including a flexible resin defining a main material and a second portion spaced from the first portion in a thickness direction; and an insulating member that envelops the first portion and the second portion while retaining a relative positional relationship between the first portion and the second portion. The insulating member is made of a material having a higher rigidity than any of the main material of the first resin substrate and that of the second resin substrate.

The various preferred embodiments of the present invention allow a plurality of resin substrates to be disposed in a limited space with a desired relative positional relationship maintained.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
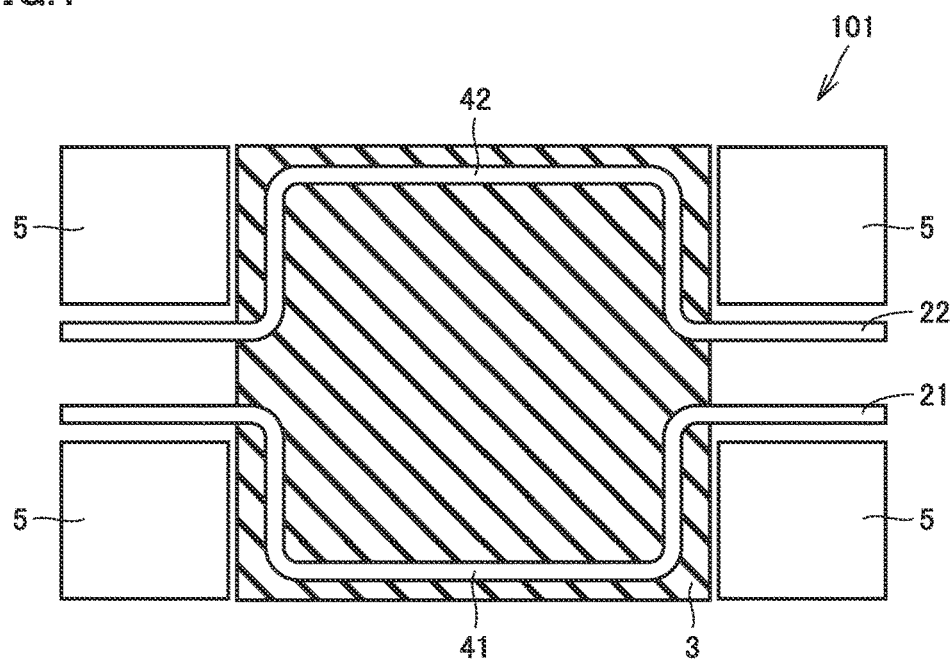
FIG. 1 is a cross section of a resin substrate combined structure according to a first preferred embodiment of the present invention.

With reference to FIG. 1, a resin substrate combined structure according to a first preferred embodiment of the present invention will be described. FIG. 1 is a cross section of a resin substrate combined structure 101 according to the present preferred embodiment.

The resin substrate combined structure 101 includes a first resin substrate 21 including a flexible resin defining a main material and includes a first portion 41, a second resin substrate 22 including a flexible resin defining a main material and includes a second portion 42 spaced from the first portion in a thickness direction, and an insulating member 3 that envelops the first portion 41 and the second portion 42 while retaining a relative positional relationship between the first portion 41 and the second portion 42. The insulating member 3 is made of a material having a higher rigidity than any of the main materials of the first resin substrate 21 and of the second resin substrate 22. A base member of the first resin substrate and a base member of the second resin substrate 22 each include a resin such as a liquid crystal polymer which has flexibility. More specifically, each of the first resin substrate 21 and the second resin substrate 22 is a resin substrate including a single layer of a plurality of flexible, sheet-shaped resin base members or a stack of such layers provided with a high frequency pattern at a prescribed position. The high frequency pattern may preferably be a transmission line, such as a stripline, a microstrip line, or a coplanar line, for example. Alternatively, the high frequency pattern may be an inductor, a coil, etc.

The resin substrate combined structure 101 includes a member 5. The resin substrate combined structure 101 includes a section sandwiched by the members 5 in the thickness direction and thus defining a narrow path. In this section, the first resin substrate 21 and the second resin substrate 22 are disposed in parallel or substantially in parallel. The resin substrate combined structure 101 includes a section which the members 5 do not sandwich in the thickness direction. In this section, the first portion 41 and the second portion 42 face each other and are both enveloped by the insulating member 3. The insulating member 3 retains a relative positional relationship of the first portion 41 and the second portion 42. The first portion 41 and the second portion 42 are spaced from each other in parallel or substantially in parallel. The distance between the first portion 41 and the second portion 42 is larger than the distance between the first resin substrate 21 and the second resin substrate 22 in the section which is not enveloped by the insulating member 3.

The present preferred embodiment allows a plurality of resin substrates to be disposed in a limited space with a desired relative positional relationship maintained.

In the present preferred embodiment, the insulating member 3 is made of a material having a higher rigidity than any of the main materials of the first resin substrate 21 and of the second resin substrate 22, and accordingly, a relative positional relationship between the first portion 41 of the first resin substrate 21 and the second portion 42 of the second resin substrate 22 is held stably. The main material of the first resin substrate 21 and the main material of the second resin substrate 22 may be identical or may be different.

In the present preferred embodiment, an example is assumed in which there is a need to provide the first resin substrate 21 and the second resin substrate 22 with a distance therebetween increased as much as possible in order to significantly reduce an electromagnetic field coupling or the like of a pattern of the first resin substrate 21 and a pattern of the second resin substrate 22. Accordingly, in a section in which the member 5 exists and the distance between the first resin substrate 21 and the second resin substrate 22 cannot be increased, the distance between the first resin substrate 21 and the second resin substrate 22 is limited to be small, whereas in a section in which the member 5 does not exist and a wide space is able to be utilized, the distance between the first resin substrate 21 and the second resin substrate 22 is increased. The first portion 41 and the second portion 42 detour to recede from each other and the first portion 41 and the second portion 42 that thus recede from each other are enveloped by the insulating member 3. While the description herein is provided with such an example defining an assumption, an idea of a preferred embodiment of the present preferred embodiment of the invention is not limited to the first portion 41 and the second portion 42 receding from each other. For example, the distance between the first resin substrate 21 and the second resin substrate 22 may be invariable in the section enveloped by the insulating member 3 as well as the section which is not enveloped thereby. Furthermore, the present preferred embodiment of the invention is also applicable to an example in which there is a need to position the first portion 41 and the second portion 42 close to each other up to a desired distance in some section, rather than including the first portion 41 and the second portion 42 receding from each other. The first portion 41 and the second portion 42 may detour in a desired section to be close to each other up to a desired distance, and in that condition, the first portion 41 and the second portion 42 may be enveloped by the insulating member 3. By applying the idea of a preferred embodiment of the present preferred embodiment, the distance between the first resin substrate 21 and the second resin substrate 22 is stabilized in any of the examples. Thus, undesirable variations in characteristics are significantly reduced for example when suppressing an electromagnetic field coupling of a pattern of the first resin substrate 21 and a pattern of the second resin substrate 22 is desired as well as for example when an electromagnetic field coupling is assumed and an element value etc. is previously set to obtain the electromagnetic field coupling as assumed.

Note that while FIG. 1 shows the first resin substrate and the second resin substrate 22 each including opposite, right and left ends extending to a portion that is uncovered with the insulating member 3 to some extent and terminated there, the first resin substrate 21 and the second resin substrate 22 may include the ends extending farther beyond the members 5. The following preferred embodiments are also similarly discussed.

Note that while herein an entirety including the members 5 is presented as the resin substrate combined structure 101, one excluding member 5 may be regarded as a single resin substrate combined structure. The following preferred embodiments are also similarly discussed.

Note that in the present preferred embodiment, as has been set forth above, the first resin substrate 21 and the second resin substrate 22 may both be a multilayer substrate or a monolayer substrate. One of them may be a multilayer substrate and the other may be a monolayer substrate.

Note that while the present preferred embodiment indicates an example in which when the second resin substrate 22 is seen in a plan view the second portion 42 is in a positional relationship such that the second portion 42 at least partially overlaps the first portion 41 of the first resin substrate 21, this is not a requirement. However, in the positionally overlapping relationship in a plan view, as in the present preferred embodiment, variation in characteristics is larger when the present preferred embodiment of the present invention is not applied, and accordingly, an effect is increased when the present preferred embodiment of the present invention is applied, which is preferable.

Second Preferred Embodiment

Figure 2:
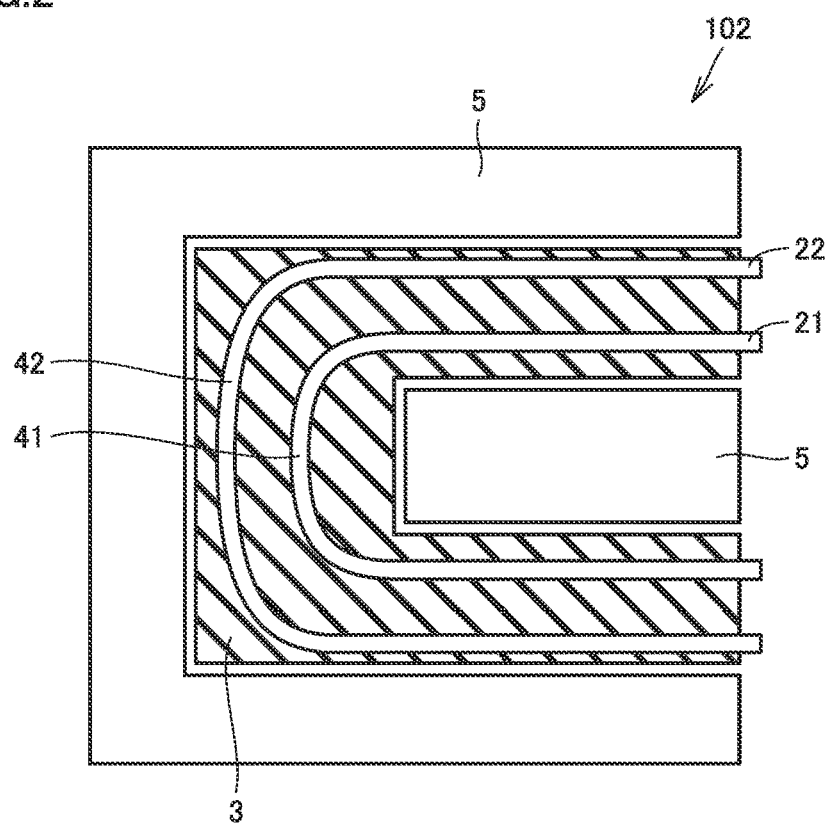
FIG. 2 is a cross section of a resin substrate combined structure according to a second preferred embodiment of the present invention.

With reference to FIG. 2, a resin substrate combined structure according to a second preferred embodiment of the present invention will be described. FIG. 2 is a cross section of a resin substrate combined structure 102 in the second preferred embodiment of the present invention.

The resin substrate combined structure 102 includes a first resin substrate 21 including a first portion 41, a second resin substrate 22 including a second portion 42 spaced from the first portion 41 in a thickness direction while having a positional relationship to at least partially overlap the first portion 41 in a plan view, and an insulating member 3 that envelops the first portion 41 and the second portion 42 while retaining a relative positional relationship between the first portion 41 and the second portion 42. The level of rigidity of the material of the insulating member 3 is as discussed in the first preferred embodiment. Note that as discussed above, the second portion 42 does not necessarily overlap the first portion 41 when the second resin substrate 42 is seen in a plan view.

In the resin substrate combined structure 102, the first portion 41 of the first resin substrate 21 and the second portion 42 of the second resin substrate 22 are disposed in a space defined by the member 5 in the form of a U-shape or substantial U-shape. The first portion 41 and the second portion do not contact each other and defines the U-shape or substantial U-shape in parallel or substantially in parallel. More specifically, the first portion 41 and the second portion include similar bent portions at intermediate portions, respectively. The insulating member 3 holds the first portion 41 and the second portion 42 that are bent in the form of the U-shape or substantial U-shape such that they are bent as they are and in a relative positional relationship as they are in.

The present preferred embodiment is also as effective as the first preferred embodiment.

As indicated in the present preferred embodiment, preferably, at least one of the first resin substrate 21 and the second resin substrate 22 includes a bent portion and the insulating member 3 envelops the bent portion. When a bent portion is thus included, how the bent portion is bent is held by the insulating member 3 in a desired state, and a particularly advantageous effect is achieved.

While a portion bent to define the U-shape or substantial U-shape as presented in the present preferred embodiment is a typical "bent portion," it is not exclusive, and as indicated in the first preferred embodiment, a portion of the first portion 41 or the second portion 42 which is bent at 90 degrees, a portion thereof which is bent to a small degree which does not reach 90 degrees, and the like may also be included in the idea of the "bent portion."

Third Preferred Embodiment

Figure 3:
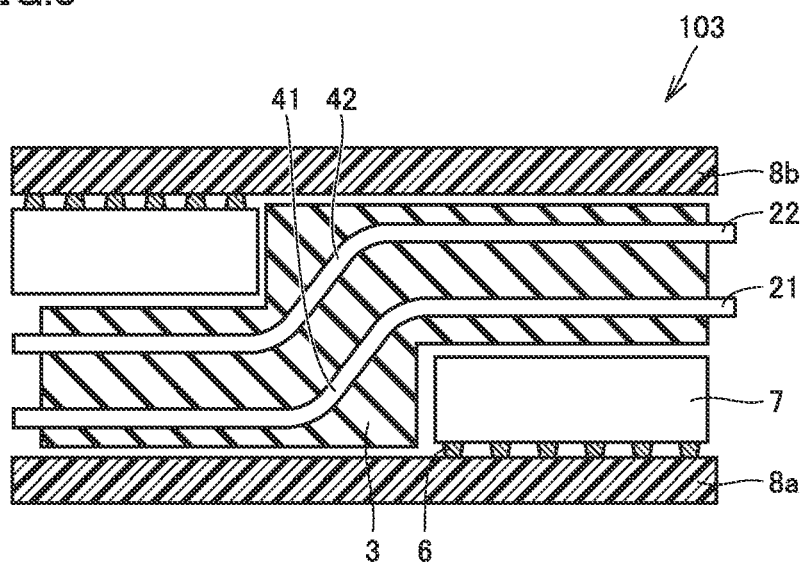
FIG. 3 is a cross section of a resin substrate combined structure according to a third preferred embodiment of the present invention.

With reference to FIG. 3, a resin substrate combined structure according to a third preferred embodiment of the present invention will be described. FIG. 3 is a cross section of a resin substrate combined structure 103 according to the third preferred embodiment of the present invention.

The resin substrate combined structure 103 includes a basic configuration similar to that described in the first or second preferred embodiment.

The resin substrate combined structure 103 does not include a member 5 and instead includes two printed-circuit boards 8a and 8b which are external circuit elements. The two printed-circuit boards 8a and 8b include inner surfaces, respectively, to each of which a component 7 which is a high frequency component is mounted via a connection member 6. A first resin substrate 21 and a second resin substrate 22 are each located at a position adjacent to components 7 provided at the external circuit elements. While one component 7 is provided per printed-circuit board, this is only an example, and the number of components 7 is not limited as such. The first resin substrate 21 and the second resin substrate 22 pass through a space between the two printed-circuit boards 8a and 8b. A first portion 41 of the first resin substrate 21 and a second portion 42 of the second resin substrate 22 are disposed such that they are bent at intermediate portions, respectively, to avoid the component 7. The first portion 41 and the second portion 42 do not contact each other and are disposed in parallel or substantially in parallel including how they are bent at the intermediate portions. An insulating member 3 holds the first portion 41 and the second portion 42 that are bent at the intermediate portions such that the insulating member 3 envelops the first portion 41 and the second portion 42 as bent as they are and in a relative positional relationship as they are in.

The present preferred embodiment is also as effective as the first preferred embodiment. Furthermore, by this configuration, a distance between the first resin substrate 21 and the component 7 and a distance between the second resin substrate 22 and the component 7 is also stabilized. This helps to adjust the location of the first resin substrate 21 and the location of the second resin substrate 22, considering an effect of adjacency of the component 7 and a pattern of the first resin substrate 21 or the second resin substrate 22 (such as variation in characteristics). This significantly reduces an effect of undesirable variation in characteristics.

While herein each resin substrate is bent twice to avoid the component 7 and thus extend, if a different number of components 7 are provided or the component 7 includes a different positional relationship or the like, how many times the resin substrate is bent and at what angle it is bent may also vary as appropriate.

Note that while herein an entirety including the printed-circuit boards 8a and 8b and the components 7 is presented as the resin substrate combined structure 103, a preferred embodiment excluding these elements may be regarded as a single resin substrate combined structure.

Fourth Preferred Embodiment

Figure 4:
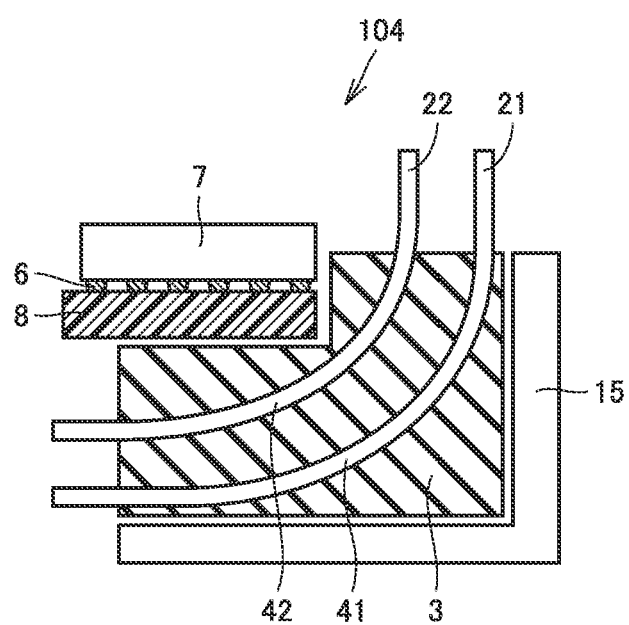
FIG. 4 is a cross section of a resin substrate combined structure according to a fourth preferred embodiment of the present invention.

With reference to FIG. 4, a resin substrate combined structure according to a fourth preferred embodiment of the present invention will be described. FIG. 4 is a cross section of a resin substrate combined structure 104 according to the fourth preferred embodiment of the present invention.

The resin substrate combined structure 104 includes a basic configuration similar to that described in the first or second preferred embodiment.

The resin substrate combined structure 104 includes a printed-circuit board 8 and a member 15. A component 7 is mounted to a surface of the printed-circuit board 8. The component 7 is adjacent to a first resin substrate 21 and a second resin substrate 22. In other words, the first resin substrate 21 and the second resin substrate 22 are located at a position adjacent to the component 7 provided to an external circuit element. The first resin substrate 21 and the second resin substrate 22 pass through a space located between the member 15 and the printed-circuit board 8 in the form of an L-shape or a substantial L-shape. A first portion 41 of the first resin substrate 21 and a second portion 42 of the second resin substrate 22 are disposed such that they are bent at intermediate portions, respectively, at or substantially at 90 degrees to avoid the printed-circuit board 8 and the member 15. An insulating member 3 holds the first portion 41 and the second portion 42 that are bent at the intermediate portions such that the insulating member 3 envelops the first portion 41 and the second portion 42 as bent as they are and in a relative positional relationship as they are in.

The present preferred embodiment is also as effective as the first to third preferred embodiments.

Note that while the resin substrate combined structure 104 is assumed to include the member 15 and the printed-circuit board 8, a structure excluding these elements may define a single resin substrate combined structure according to a preferred embodiment of the present invention.

Fifth Preferred Embodiment

Figure 5:
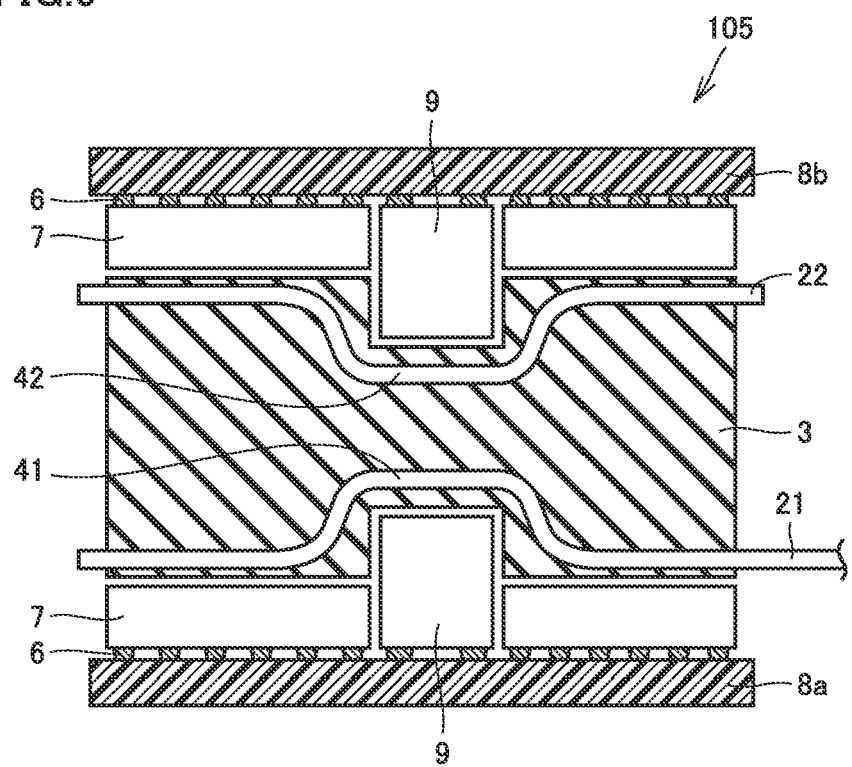
FIG. 5 is a cross section of a resin substrate combined structure according to a fifth preferred embodiment of the present invention.

With reference to FIG. 5, a resin substrate combined structure according to a fifth preferred embodiment of the present invention will be described. FIG. 5 is a cross section of a resin substrate combined structure 105 according to the fifth preferred embodiment of the present invention.

The resin substrate combined structure 105 includes a basic configuration similar to those described in the previous preferred embodiments.

The resin substrate combined structure 105 includes printed-circuit boards 8a and 8b disposed opposite to each other in parallel or substantially in parallel. The printed-circuit boards 8a and 8b include inner surfaces, respectively, to which components 7 and 9 are mounted via a connection member 6. These components 7 and 9 are adjacent to a first resin substrate 21 and a second resin substrate 22. In other words, the first resin substrate 21 and the second resin substrate 22 are each located at a position adjacent to the components 7 and 9 provided to an external circuit element. The component 9 is larger in height than the component 7. The first resin substrate 21 and the second resin substrate 22 pass through a space located between the printed-circuit boards 8a and 8b. A first portion 41 of the first resin substrate 21 and a second portion 42 of the second resin substrate 22 are disposed while detouring at intermediate portions, respectively, to avoid a portion at which the component 9 projects. The first portion 41 and the second portion 42 are out of contact with each other. At a portion at which the components 9 are opposite to each other and a gap allowing passage is narrow, the distance between the first resin substrate 21 and the second resin substrate 22 is decreased. An insulating member 3 holds the first portion 41 and the second portion 42 that are bent at the intermediate portions such that the insulating member 3 envelops the first portion 41 and the second portion 42 as bent as they are and in a relative positional relationship as they are in.

The present preferred embodiment is also as effective as the first to fourth preferred embodiments.

Note that while the resin substrate combined structure 105 is assumed to include the components 7 and 9 and the printed-circuit boards 8a and 8b, a structure excluding these elements may define a single resin substrate combined structure according to a preferred embodiment of the present invention.

Sixth Preferred Embodiment

Figure 6:
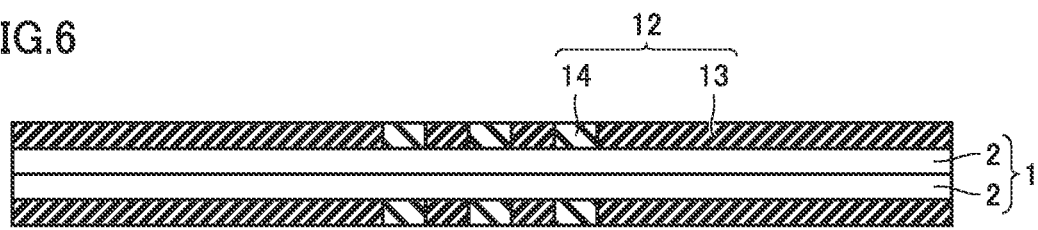
FIG. 6 is a cross section of a reference substrate included in a resin substrate combined structure according to a sixth preferred embodiment of the present invention, in a state before the reference substrate is bent.
Figure 7:
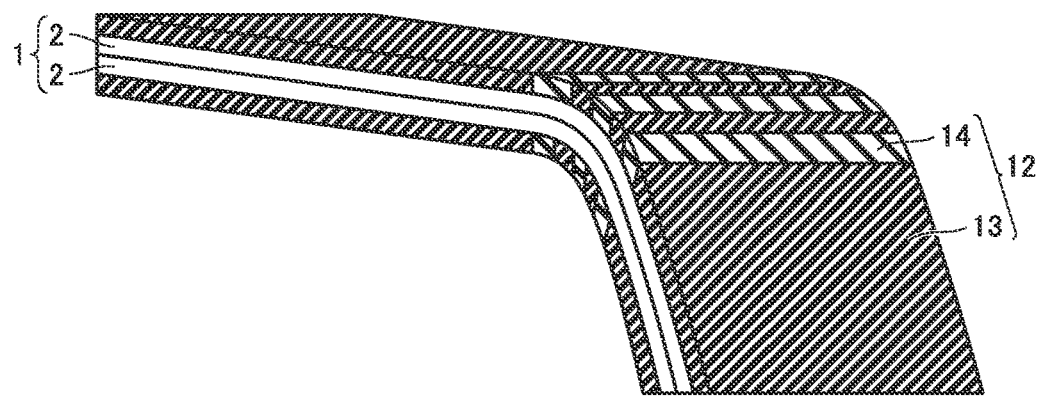
FIG. 7 is a perspective view of the reference substrate included in the resin substrate combined structure according to the sixth preferred embodiment of the present invention, in a bent state.

With reference to FIGS. 6 and 7, a resin substrate combined structure according to a sixth preferred embodiment of the present invention will be described. What is noted in the present preferred embodiment is a detail of a portion at which the first portion 41 of the first resin substrate 21 and the second portion 42 of the second resin substrate 22 in each of the above preferred embodiments are bent in a state in which they are enveloped by an insulating member 3.

While the figure of each preferred embodiment above shows the first portion 41 or the second portion 42 simply bent, in the present preferred embodiment, at this bent portion, to cover a surface of the first portion 41 or the second portion 42, a bending adjustment layer 12 is provided.

In the resin substrate combined structure in the present preferred embodiment, when one of the first resin substrate 21 and the second resin substrate 22 serves as a reference substrate, the reference substrate includes a bent portion, a bending adjustment layer 12 which includes a portion higher in flexural rigidity than the reference substrate is provided to cover at least a portion of a main surface of the reference substrate, and at least a portion of the bending adjustment layer 12 is enveloped by an insulating member 3.

FIG. 6 is a cross section of a state before the reference substrate is bent. FIG. 6 shows a stack 1 included in a reference substrate which is one of the first resin substrate 21 or the second resin substrate 22 as an example. The stack 1 preferably includes two layers of a resin base member 2. The resin base member 2 is in the form of a sheet. A bending adjustment layer 12 is provided on opposite surfaces of the stack 1 included in the reference substrate. FIG. 7 shows the FIG. 6 reference substrate bent.

As indicated in the present preferred embodiment, when the reference substrate includes a bent portion and the bending adjustment layer 12 is provided to cover at least a portion of a surface of the reference substrate, then, at the time of production, also in a stage before forming the insulating member 3, by an effect of the bending adjustment layer 12, the reference substrate is held at a desired degree of bending. Thus, in the step of forming the insulating member 3 to envelop the bent portion, the reference substrate is prevented from assuming an undesirable posture departing from the desired degree of bending. Since the bending adjustment layer 12 contributes to maintaining the reference substrate's degree of bending, the insulating member 3 unset may be injected while the maintaining of a desired degree of bending is further ensured. As a result, at least a portion of the bending adjustment layer 12 is enveloped by the insulating member 3. After the insulating member 3 sets, the bending adjustment layer 12 may also be completely enveloped by the insulating member 3 together with the reference substrate, however, the bending adjustment layer 12 may remain in the insulating member 3 in that way.

Figure 8:
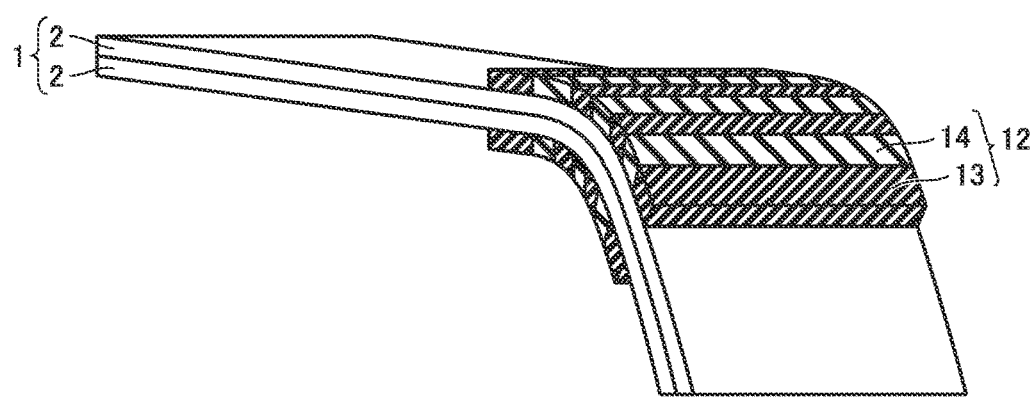
FIG. 8 is a perspective view of a reference substrate included in a first exemplary variation of the resin substrate combined structure according to the sixth preferred embodiment of the present invention of the present invention, in a bent state.

While in the example shown in FIG. 7, the bending adjustment layer 12 preferably extends over both a bent portion of a reference substrate and a portion thereof other than the bent portion, as shown in FIG. 8, the bending adjustment layer 12 may be locally formed only at the bent portion. Furthermore, not only the bending adjustment layer 12 covering a reference substrate's opposite surfaces, but covering only one surface of the reference substrate, as shown in FIG. 9, is also effective to some extent.

The bending adjustment layer 12 preferably includes an alternating arrangement portion in which a first hardness layer 13 higher in flexural rigidity than the reference substrate and a second hardness layer 14 lower in flexural rigidity than the first hardness layer 13 are alternatingly disposed in a plan view and the alternating arrangement portion is that covers at least the bent portion of the reference substrate. The examples shown in FIG. 6 to FIG. 9 satisfy this condition. By adopting this configuration, a local, rapid bending, a curved portion having an excessively large radius of curvature, and the like are avoided.

Figure 9:
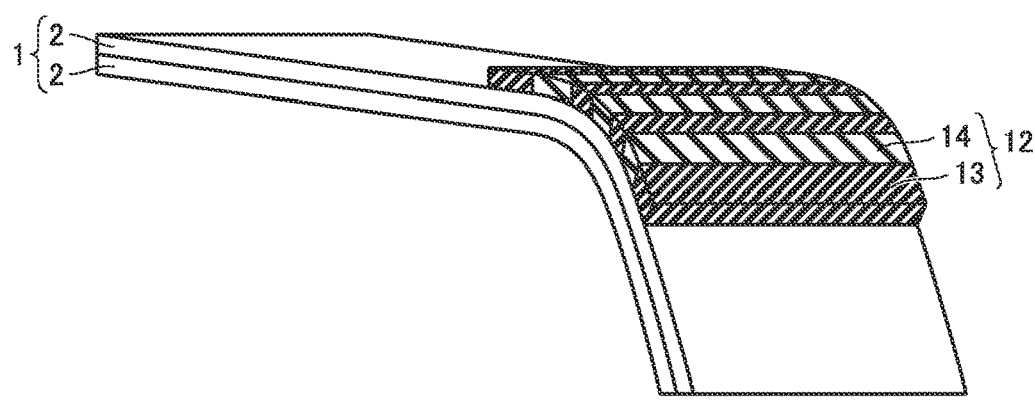
FIG. 9 is a perspective view of a reference substrate included in a second exemplary variation of the resin substrate combined structure according to the sixth preferred embodiment of the present invention, in a bent state.

While in the examples shown in FIG. 8 and FIG. 9, the bending adjustment layer 12 is that covers a bent portion of a reference substrate locally, on the contrary, the bending adjustment layer 12 may be disposed to avoid the bent portion and cover a portion other than the bent portion. More specifically, the bending adjustment layer 12 may include a layer that covers a portion of the reference substrate other than the bent portion and is higher in flexural rigidity than the reference substrate. By adopting this configuration, the reference substrate's posture may be held at the portion other than the bent portion, and even if the bent portion is not covered directly, the bent portion's degree of bending may be in a desired state.

It is preferable that for each preferred embodiment above the insulating member 3 is made of a thermosetting resin defining a main material, for example. By adopting this configuration, the insulating member 3 may be formed easily.

As a non-limiting example of a production method, a method of producing the resin substrate combined structure 101 according to the first preferred embodiment will be described. Initially, a resin substrate included in the resin substrate combined structure 101 is produced. A foundation of the resin substrate is a stack, which can be produced according to a known method. The stack is produced in a method, for example, as follows:

(1) A copper foil-attached resin sheet is prepared. This copper foil-attached resin sheet includes a resin sheet which is a thermoplastic resin having flexibility. This resin sheet corresponds to a resin base member. The thermoplastic resin may be liquid crystal polymer (LCP), polyetheretherketone (PEEK), thermoplastic polyimide (thermoplastic PI), thermoplastic fluororesin, etc., for example.

(2) A resist pattern is printed on a surface of the copper foil-attached resin sheet having the copper foil.

(3) With the resist pattern used as a mask, the copper foil includes an unwanted portion etched away using acid. This forms a conductor pattern such as a high frequency pattern.

(4) With an alkaline liquid, the resist pattern is removed and subsequently a neutralization process is performed.

(5) Laser machining is used to provide the resin sheet with a hole.

(6) A conductive paste is introduced into the hole made by laser machining.

(7) A plurality of resin sheets are stacked.

(8) The stacked resin sheets are pressed. More specifically, the sheets are compressed while they are heated at a temperature which does not exceed the resin sheet's glass transition temperature (e.g., 250-300 degrees centigrade). Thus, the stack is obtained. The stack is processed as required and a resin substrate is thus obtained.

Then, a plurality of resin substrates are each bent in a desired shape and disposed such that these bent portions are located inside a die. This die includes an internal space having a shape corresponding to that of the insulating member 3. The material of the insulating member 3 is not necessarily thermosetting resin, however, as has been set forth above, thermosetting resin is preferable. The thermosetting resin as referred to herein may be epoxy resin for example. The epoxy resin may be granular or may be liquefied.

Note that when the epoxy resin initially has a granular state, it is preliminarily pressed in a die at 150-200 degrees centigrade and then once cooled. The epoxy resin is then pressed in the die conclusively at 150-200 degrees centigrade for a longer time than the preliminary press.

When the epoxy resin initially has a liquid state, the epoxy resin is semi-set in a die at 100-130 degrees centigrade and then completely set at 120-180 degrees centigrade.

The content is removed from the die. Thus, a plurality of resin substrates having a bent portion with the insulating member 3 formed to envelop the bent portion is obtained. The resin substrate combined structure 101 is obtained by combining the member 5 with this as preferred.

Note that, as the thermosetting resin, other than epoxy resin, phenol resin, bismaleimide resin, additional types such as polyimide resin, cyanate resin, etc. may be used.

The resin substrate combined structures described in the second to fifth preferred embodiments may also be produced in a similar manner using a die.

Furthermore, when the technique described in the sixth preferred embodiment is used, the following may be done.

After a resin substrate is produced, a bending adjustment layer 12 is previously produced, using a first die, to be bonded to the resin substrate. The resin substrate with the bending adjustment layer 12 bonded thereto is bent in a desired shape. Then, a plurality of resin substrates are each bent in a desired shape and disposed such that these bent portions are located inside a second die together with the bending adjustment layer 12. Thus, a material such as thermosetting resin is poured into the second die to form an insulating member 3. This may reduce a probability of the resin substrate being deformed into an undesirable shape within the second die before the insulating member 3 is set. Note that the internal space of the first die is the shape of the bending adjustment layer 12 and the internal space of the second die is the shape of the insulating member 3.

It should be understood that the preferred embodiments disclosed herein are illustrative and non-restrictive in any respect. The scope of the present invention is defined by the terms of the claims, rather than the description above, and is intended to include any modifications within the meaning and scope equivalent to the terms of the claims.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A resin substrate combined structure comprising:
a first resin substrate including a flexible resin defining a main material and including a first portion;
a second resin substrate including a flexible resin defining a main material and including a second portion spaced from the first portion in a thickness direction; and
an insulating member that envelops the first portion and the second portion while retaining a relative positional relationship between the first portion and the second portion; wherein
the insulating member includes a material with a higher rigidity than any of the main material of the first resin substrate and the main material of the second resin substrate; and
the portions of the insulating member that envelop the first portion and the second portion are in direct contact with the first portion and the second portion.

2. The resin substrate combined structure according to claim 1, wherein at least one of the first resin substrate and the second resin substrate includes a bent portion and the insulating member envelops the bent portion.

3. The resin substrate combined structure according to claim 1, wherein when the second resin substrate is seen in a plan view, the second portion at least partially overlaps the first portion.

4. The resin substrate combined structure according to claim 1, wherein the first resin substrate and the second resin substrate are located at a position adjacent to a component provided at an external circuit element.

5. The resin substrate combined structure according to claim 1, wherein when one of the first resin substrate and the second resin substrate is a reference substrate, the reference substrate includes a bent portion, a bending adjustment layer which includes a portion higher in flexural rigidity than the reference substrate covers at least a portion of a main surface of the reference substrate, and at least a portion of the bending adjustment layer is enveloped by the insulating member.

6. The resin substrate combined structure according to claim 5, wherein the bending adjustment layer includes an alternating arrangement portion in which a first hardness layer higher in flexural rigidity than the reference substrate and a second hardness layer lower in flexural rigidity than the first hardness layer are alternatingly disposed in a plan view and the alternating arrangement portion is that covers at least the bent portion of the reference substrate.

7. The resin substrate combined structure according to claim 5, wherein the bending adjustment layer includes a layer that covers a portion of the reference substrate other than the bent portion and is higher in flexural rigidity than the reference substrate.

8. The resin substrate combined structure according to claim 1, wherein the insulating member includes thermosetting resin as the main material.

9. The resin substrate combined structure according to claim 4, wherein
the external circuit element includes a first printed circuit board; and
the component is mounted on a surface of the first printed circuit board.

10. The resin substrate combined structure according to claim 3, wherein the first portion of the first resin substrate and the second portion of the second resin substrate are disposed in a space in a U-shape or a substantial U-shape and the insulating member holds the first portion and the second portion such that the first portion and the second portion are bent in the U-shape or the substantial U-shape.

11. The resin substrate combined structure according to claim 1, wherein the first portion and the second portion do not contact each other and are disposed in parallel or substantially in parallel.

12. The resin substrate combined structure according to claim 9, further comprising:
a second printed circuit board;
a second component that is mounted on a surface of the second printed circuit board; wherein
the surface of the first printed circuit board and the surface of the second printed circuit board face each other; and
the first resin substrate and the second resin substrate pass through a space between the first printed circuit board and the second printed circuit board.

13. The resin substrate combined structure according to claim 12, wherein
the first portion of the first resin substrate and the second portion of the second resin substrate are disposed such that the first portion and the second portion are bent at intermediate portions, respectively, to avoid the first component and the second component such that the first portion and the second portion do not contact each other and are disposed in parallel or substantially in parallel.

14. The resin substrate combined structure according to claim 9, wherein the component is a high frequency component.

15. The resin substrate combined structure according to claim 12, wherein each of the first component and the second component is a high frequency component.

16. The resin substrate combined structure according to claim 12, further comprising a third component that is mounted on the surface of the first printed or is mounted on the surface of the second printed circuit board; wherein
the first component or the second component is larger in height than the third component.

17. The resin substrate combined structure according to claim 9, wherein the first resin substrate and the second resin substrate pass through a space located between a member and the first printed-circuit board in the form of an L-shape or a substantial L-shape.

18. The resin substrate combined structure according to claim 9, wherein at least one of the first resin substrate and the second resin substrate includes a bent portion and the insulating member envelops the bent portion.

19. The resin substrate combined structure according to claim 12, wherein
at least one of the first resin substrate and the second resin substrate includes a bent portion and the insulating member envelops the bent portion; and
the bent portion is located at a gap between the first component and the second component.

20. The resin substrate combined structure according to claim 19, wherein a distance between the first portion of the first resin substrate and the second portion of the second resin substrate is less than a distance between another portion of the first resin substrate and another portion of the second resin substrate.

* * * * *